US006922456B2

United States Patent
Greenlaw et al.

(10) Patent No.: US 6,922,456 B2
(45) Date of Patent: Jul. 26, 2005

(54) COUNTER SYSTEM AND METHOD

(75) Inventors: Jonathan E. Greenlaw, Roseville, CA (US); Paul O'Connor, Grass Valley, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 553 days.

(21) Appl. No.: 10/106,536

(22) Filed: Mar. 25, 2002

(65) Prior Publication Data
US 2003/0182080 A1 Sep. 25, 2003

(51) Int. Cl.[7] .................................................. G06M 3/00
(52) U.S. Cl. .............................. 377/26; 377/13; 377/16; 377/37; 377/49; 709/224; 365/236

(58) Field of Search .............................. 377/26, 13, 16, 377/37, 49; 709/224; 365/236

(56) References Cited

U.S. PATENT DOCUMENTS 6,097,781 A * 8/2000 Wright et al. ................. 377/26
6,314,155 B1 * 11/2001 Shona et al. ................. 377/26

* cited by examiner

Primary Examiner—Margaret R. Wambach

(57) ABSTRACT

A system and method for performing counting operations for a plurality of components is disclosed. A memory stores a plurality of counts from different components. The memory is coupled to a counter and the plurality of counts are accessible to the adder for adding addends to the plurality of counts. A count engine controls the adding of the addends to the plurality of counts.

26 Claims, 5 Drawing Sheets

COUNTER SYSTEM AND METHOD

TECHNICAL FIELD

The present invention relates to electronic counters.

BACKGROUND ART

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic devices providing these advantageous results depend upon accurate tracking of diverse statistical information related to a variety of metrics. The tracking of the statistical information often involves counting the occurrence of numerous different events or conditions. For example, electronic systems are often required to keep track of various operational events that may occur (such as power failures, processing errors, packets of information communicated, etc.). Traditionally, significant resources are required to count the various items of usual interest.

Numerous electronic systems include integrated circuits on single substrate chips. The functionality a chip is capable of providing usually depends on the resources included in a chip. Resources on a chip are usually at a premium since there is typically a limited number of components included in the logic area of a die. As more resources on a die are assigned to performing certain tasks fewer resources are available to provide greater functionality. For example, as more resources are consumed to support system management tasks such as tracking operational conditions or events there are fewer resources available for application tasks. Counters are often used in traditional systems to track operational conditions or events.

Electronic counter circuits designed to manipulate and track counts are typically limited to tracking single items, such as the occurrence of a particular event or existence of a certain condition. Each counter usually requires its own incrementor component or adder and a set of registers to store a resulting value. For example, an n bit counter usually consists of n flip flops that generally drive n output lines. Counters are usually sequential circuits that go through a prescribed sequence of states when an input pulse is applied. However, many applications require flexible incremental changes in a count and additional adder components are often required.

Systems typically require counts on a large number of different items. For example, network management operations often require media access controllers to keep a count on a number of different things. Media access blocks usually require each item counted to have individual count resources. A media access controller block often includes a media access controller, a register block and a network management counter block. The media access controller performs data movement operations. The register block contains registers used to configure the media access controller. The network management counter counts various network events such as collisions, data bytes, and errors. For example, networks often require a media access controller to track counts of a variety of things such as how many packets consist of a specified number of bytes (e.g., 64) and each tracked packet size requires its own counter circuit. So if a media access controller requires 30 or 40 different events or conditions to be tracked, each media access controller consumes resources associated 30 or 40 counter circuits.

The consumption of limited resources by a particular device is usually exacerbated in most instances since systems usually have multiple similar devices. For example, systems usually have numerous media access controllers per chip. While the circuitry for a given particular individual item counter may be simple, duplicating those circuits numerous times for each different item typically consumes valuable resources and chip space at an exponential rate.

Thus, the prior art requires significant dedicated resources to perform the various counting functions for numerous different components that are often included in traditional systems.

DISLOSURE OF THE INVENTION

A system and method for performing counting operations for a plurality of components is disclosed. A memory stores a plurality of counts from different components. The memory is coupled to a counter and the plurality of counts are accessible to the adder for adding addends to the plurality of counts. A count engine controls the adding of the addends to the plurality of counts.

BEST MODES FOR CARRYING OUT THE INVENTION

Reference will now be made in detail to the preferred embodiments of the invention, a counter system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood the present invention may be practiced without these specific details. In other instances, some items have not been described in detail as not to unnecessarily obscure aspects of the current invention.

A counting system and method in accordance with one embodiment of the present invention utilizes a single counting unit to track counts on multiple items. The counting unit includes a single memory component for storing various count values. The various count values are accessed and manipulated in accordance with directions from a single count controller. Count value manipulation operations (e.g., adding, incrementing, etc.) are preformed by a single adder that supports count value manipulation for multiple items. The single counting unit provides the same count functionality as traditional counters dedicated to counting single items but does not consume as much limited system space and/or resources. For example, the single memory component is capable of providing the same count storage capacity as traditional counting systems yet occupies less space and consumes less resources than required for each traditional counter. Thereby a system can provide greater levels of counter flexibility in an economical and yet convenient manner.

Figure 1A:
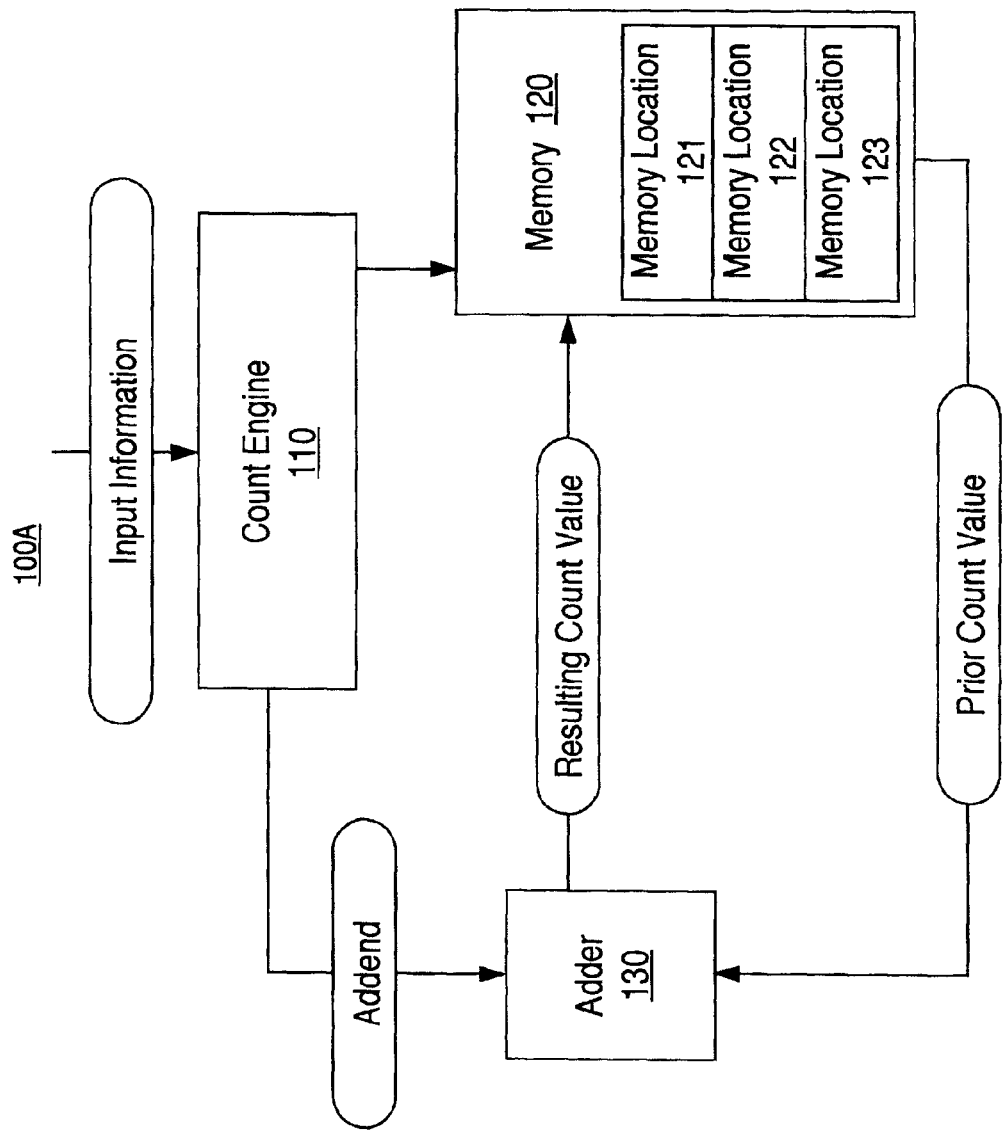
FIG. 1A is a block diagram showing a counter system for performing counter operations on a plurality of items from different components in accordance with one embodiment of the present invention.

FIG. 1A is a block diagram illustrating counter system 100A in accordance with one embodiment of the present invention. Counter system 100A comprises count engine 110, count memory 120, and adder 130. Count memory 120 is coupled to count engine 110 and adder 130. The components of counter system 100A cooperatively operate to provide flexible count tracking for multiple items. A count memory 120 stores a plurality of count values associated with different items (e.g., in memory locations 121 through 123). Adder 130 adds addends to the count values stored in count memory 120 and count engine 110 controls the adding operations.

Count engine 110 receives input information, including information associated with count items, and determines if the information includes an indication that a count value associated with an item should be altered to reflect a true count of the item. In one embodiment of the present invention, the input information is a plurality of incoming vectors (e.g., a sting of bits) that include count manipulation indications (e.g., appropriate updates for count values). Count engine 110 decodes the vectors. The decoded information provides an indication of the existence of a condition or an occurrence of an event that necessitates a manipulation of a count value. For example, a network transmission error occurrence indication means a count value that tracks the number of network transmission errors should be incremented.

When the input information includes an indication that a count value manipulation should occur, count engine 110 supervises the operations and directs a manipulation of the count value. Count engine 110 directs memory 120 to forward the "prior" count value in a memory location to adder 130. The memory location is associated with a count item (e.g., a network transmission error count). Count engine 110 directs incrementing of count values in memory 120. Count engine 110 also directs selection of an addend value that is provided to adder 130 for addition with the prior count value from memory 120. The addend value is based upon received input information. Adder 130 adds the addend to the prior count value and transmits the "resulting" count value to memory 120 for storage.

Count engine 110 is capable of handling count operations for a number of items, including counts associated with different components, without providing dedicated counter combinatorial logic for each item. In count system 100A, each count item is provided with a count memory location within a memory array. For example, the count memory location may be included in an economical implementation utilizing a random access memory (RAM). The count memory location within the memory array for each item and an adder circuit that is utilized to provide adding functions for a number of different item counts consumes much less chip resources than providing individual counter circuits and storage registers for each item counted. Count engine 110 includes a counter control state machine that directs pipelined count manipulation operations.

Figure 1B:
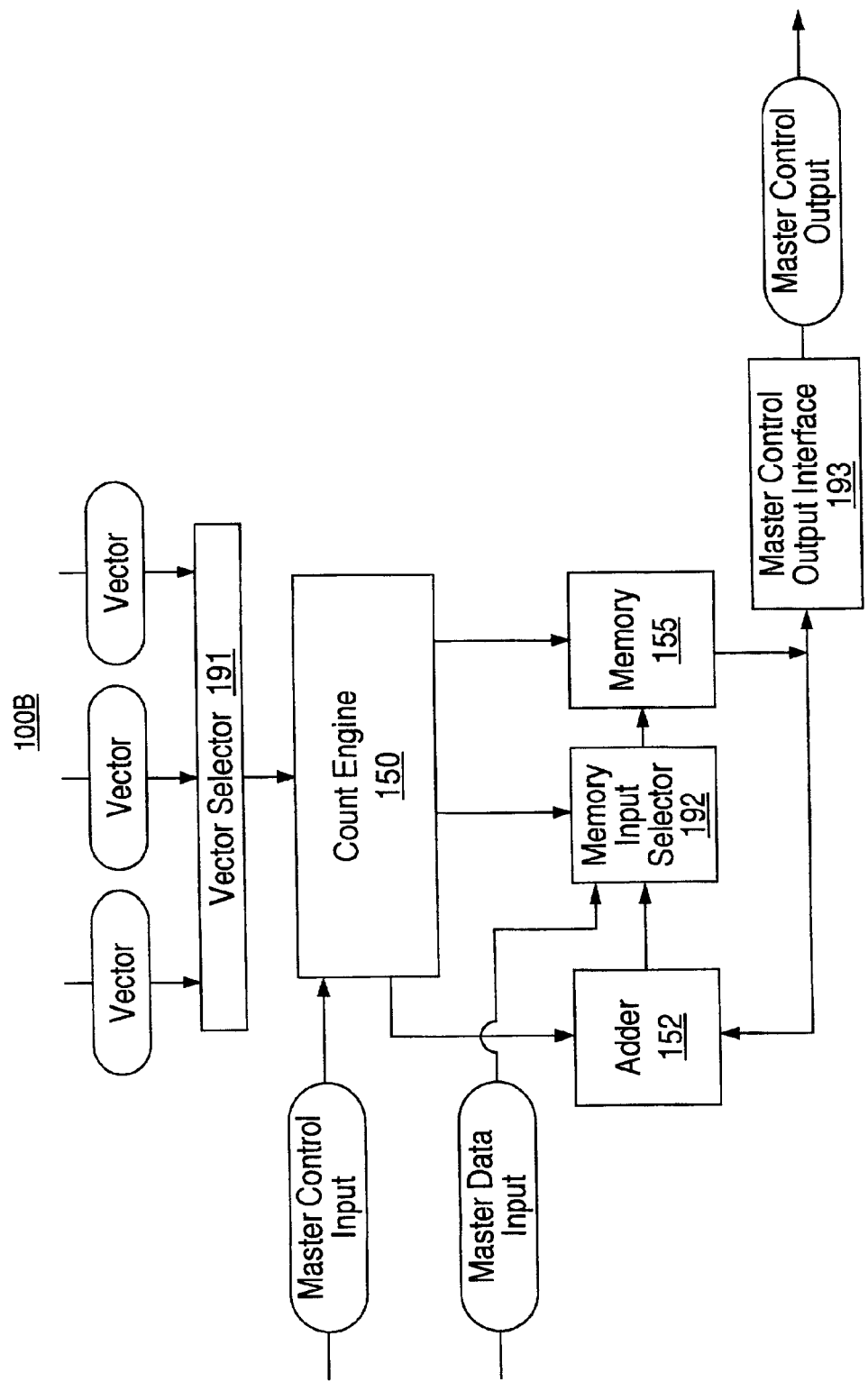
FIG. 1B is a block diagram illustrating an embodiment of a present invention counter system for counting multiple values that also has added capabilities for handling master count operations.

FIG. 1B is a block diagram showing counter system 100B in accordance with another embodiment of the present invention. Counter system 100B includes features similar to counter system 100A and also has the added capabilities of handling master count operations (e.g., operations associated with a centralized processing unit). Counter system 100B comprises count engine 150, adder 152, memory 155, vector selector 191, memory input selector 192 and master control output interface 193. Count engine 150 is coupled to adder 152, memory 155, vector selector 191, memory input selector 192. Memory 155 is coupled to master control output interface 193.

Similar to counter system 100A, the components of counter system 100B cooperatively operate to provide flexible count tracking of multiple counts. Counter system 100B is also capable of handling input data from several sources and coordinating its operations with a master device (e.g., a central processing unit). Count memory 155 stores count values for a variety of different items in different memory locations. The different items may be associated with different components (e.g., media access controllers) or devices. Adder 152 adds addends to the count values stored in memory 155. Count engine 150 controls adding of addends to the count values stored in memory 155. Count engine 150 is also capable of handling count instructions and data from a master device. Count engine 150 is capable of directing memory input selector 192 to load master data input information or adder 152 information in memory 155 as resulting count values. Count engine 150 is also capable of directing master control output interface 193. For example, count engine 150 may direct master control output interface 193 to output information for higher level statistical manipulation or other control operations of a master controller.

Vector selector 191 selects between a number of incoming vectors comprising statistical information. In one implementation the information input includes count vectors (e.g., associated with MAC operations) and vector selector 191 comprises an arbiter that polls various vector inputs using an arbitration scheme (e.g., a round robin arbitration scheme). Incoming vectors include a valid bit for providing an indication to vector selector 191 whether the vector should be selected or not. A strobe signal is sent to the devices forwarding the vectors and the devices reset the valid bit.

In an alternate embodiment, vector selector 191 includes an input buffer (e.g., a first in first out buffer) that stores incoming information. The input buffer stores received input information while the system is performing other operations. This temporary storage enables the system to handle simultaneous counter update requests from multiple sources (e.g., a MAC). In a round robin arbitration example, the arbitration mechanism checks each input for an indication a vector is valid. If it is valid the vector is entered in the buffer and the corresponding strobe signal is toggled to indicate the vector is read. If it is not valid the vector will be skipped and on the next clock another vector valid bit will be checked.

Counter system 100B includes components for handling master count operations. Memory input selector 192 selects whether an output of adder 152 or a master data input signal is input to memory 155. Master control output interface 193 stores master control output information that is waiting to be communicated to a master control system.

Figure 2:
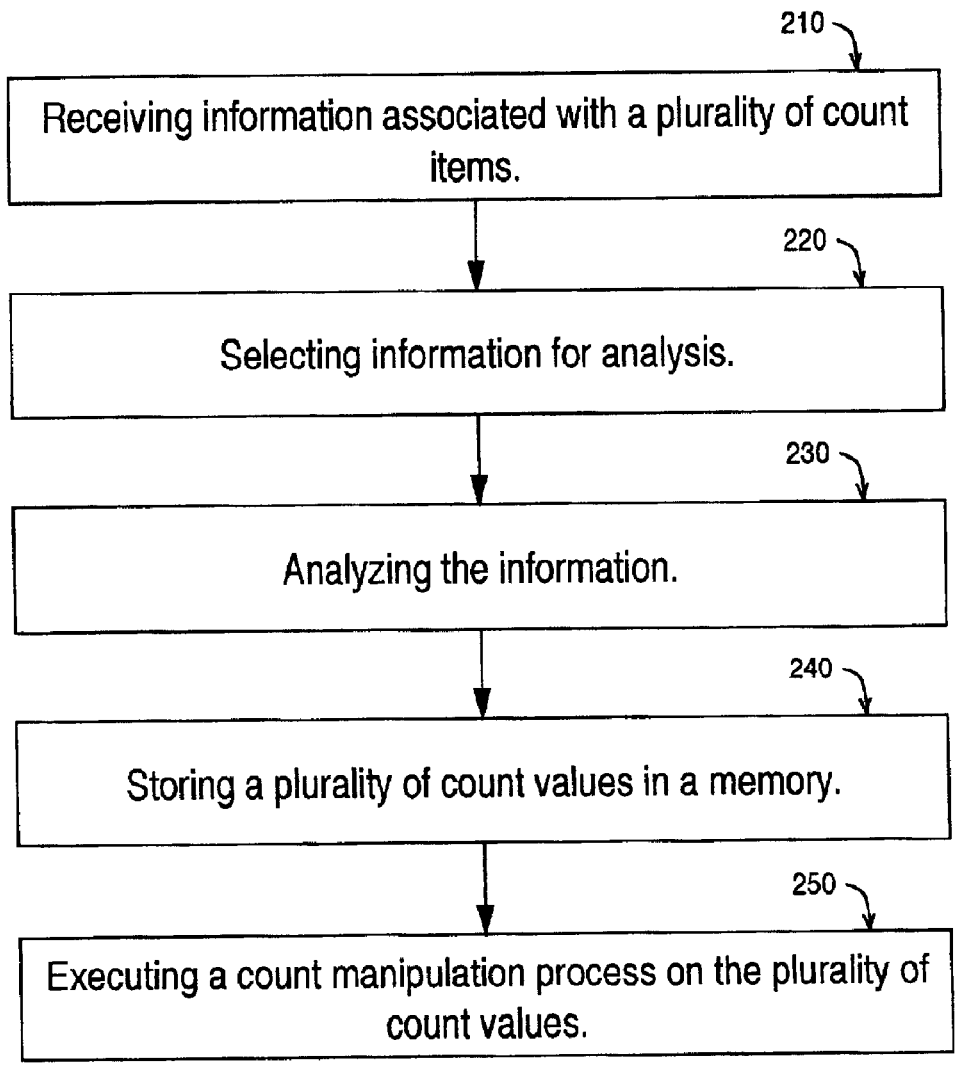
FIG. 2 is flow chart showing a counter method that facilitates count tracking for a number of different items in accordance with another embodiment of the present invention.

FIG. 2 shows a flow chart of counter method 200, a counter method in accordance with one embodiment of the present invention. Counter method 200 facilitates count tracking for a number of different items. The count items tracked by counter method 200 may be associated with multiple elements. For example, counter method 200 is capable of tracking different counts from several media access controllers.

In step 210, information associated with a plurality of count items is received from multiple elements. A determination is made if the information indicates the existence of conditions or the occurrence of events associated with a counting action. In one exemplary implementation, the information includes statistical information related to operations of a system or a network.

Information for analysis is selected at step 220. The information is included in a plurality of vectors in one exemplary implementation and one of the plurality of vectors is selected for analysis. The selection may be based upon an arbitration scheme that enables access to the different vector information (e.g., sequentially).

The information is analyzed in step 230. The analysis is directed to determining what manipulations of a count value are warranted. A decision is made on the amount a count value should be incremented. Input vector information is decoded and an incrementing amount is derived based upon the contents of the decoded input vector information.

At step 240, a plurality of count values are stored in a memory. The plurality of count values are associated with different items. The count values may be associated with a communication packet (e.g., the number of octets received in packets with errors) or the number of times a system enters a state.

In step 250, a count manipulation process is executed on a plurality of count values in a memory. A count manipulation process updates a plurality of count values in a memory to indicate the number of times a condition existed or state is entered. For example, a count value of a number of frames transmitted after being involved in a collision is incremented or added to an addend. The previous total is added to a number of frames transmitted after being involved in a collision during a certain time period.

Figure 3:
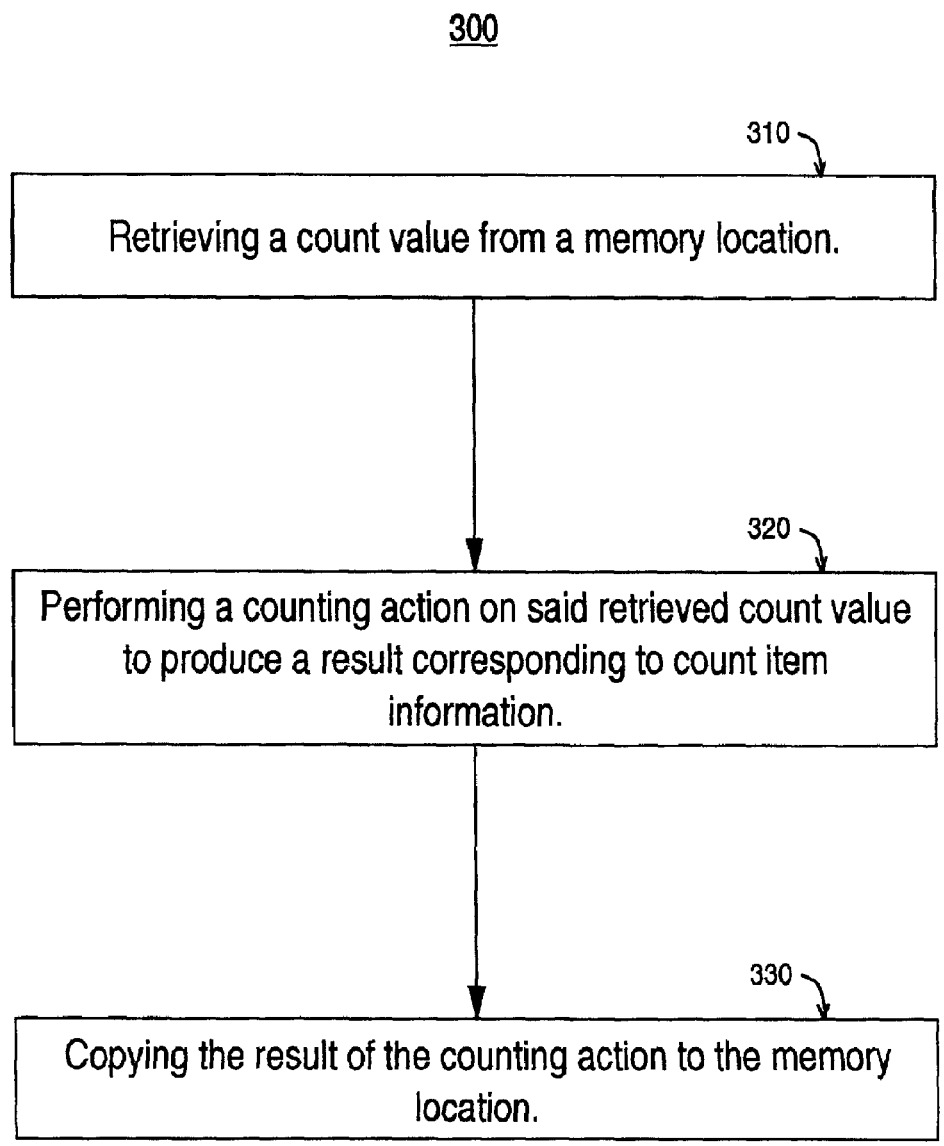
FIG. 3 is a flow chart illustrating one exemplary implementation of a present invention count manipulation process for incrementing a count.

FIG. 3 is a flow chart showing count manipulation process 300 in accordance with one embodiment of a present invention count manipulation process. Count manipulation process 300 may be performed as part of step 250 in counter method 200.

In step 310, a count value is retrieved from a memory location. The count value that is retrieved corresponds to a count value of an item before the present count manipulation operations.

At step 320, a counting action is performed on the retrieved count value to produce a result corresponding to count item information (e.g., received in step 210). In one implementation, the retrieved count value is incremented by a fixed amount. In another implementation, the retrieved count value is increased by a variable amount (e.g., a master control input amount). For example, the counting action includes adding a master control input to the value.

In step 330 the result of the counting action is copied to the memory location. The result represents the latest count value for an item. This count value is also available for downloading associated with master control operations. Master control operations provide a number of overall system controls including permitting count values to be read and passed up to higher layers for system management decisions. Master control operations may also help avoid rollover problems in some embodiments by reading the contents before the rollover occurs.

Figure 4:
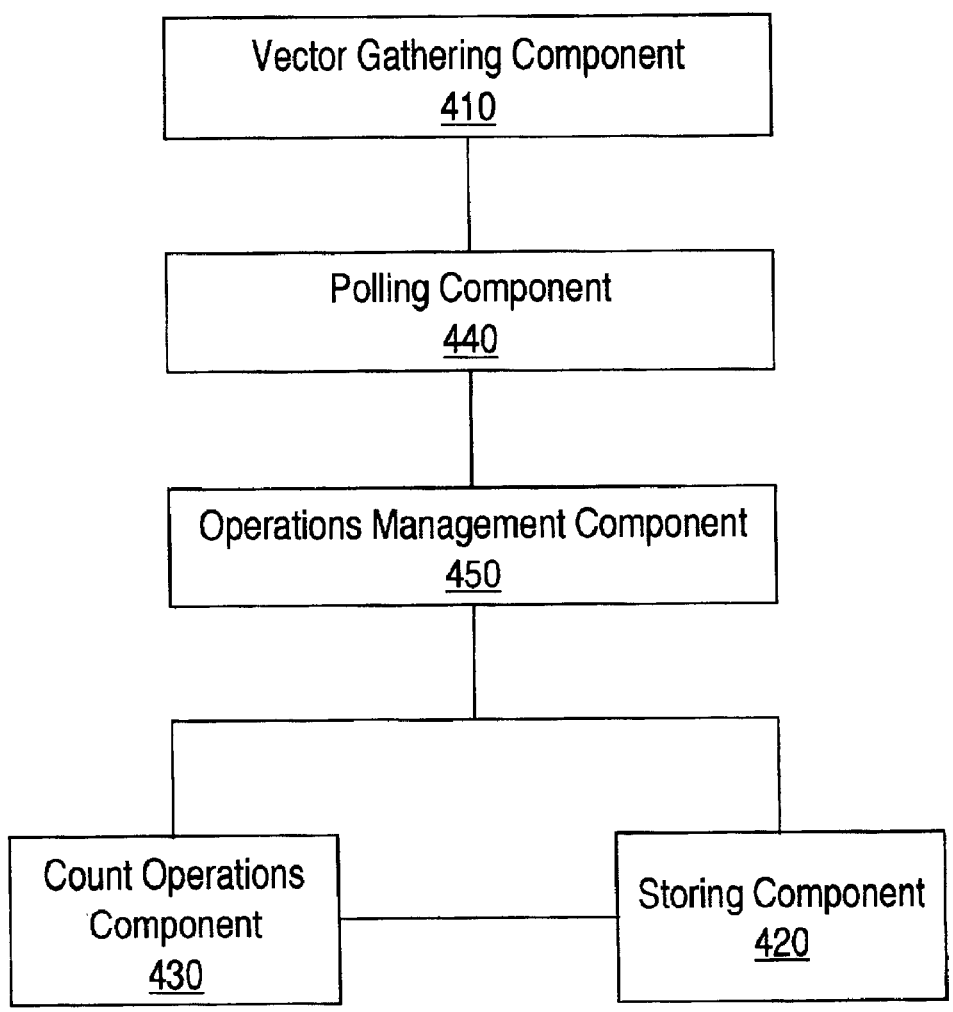
FIG. 4 is a block diagram showing another counting system with vector polling capabilities in accordance with one implementation of the present invention.

It should be appreciated that the present invention can be readily adapted for implementation by a variety of component configurations. FIG. 4 is a block diagram of one embodiment of a present invention a counting system comprising vector gathering component 410, storing component 420, a count operations component 430, polling component 440, and operations management component 450. Vector gathering component 410 gathers a plurality of count update vectors. Storing component 420 stores a plurality of count values associated with the count update vectors. Count operations component 430 performs counting operations on the count update values. Operations management component 450 manages the counting operations. Polling component 440 polls the plurality of count update vectors. Polling component 440 picks each one of the plurality of counting operation vectors for decoding one at a time in an accordance with an arbitration scheme.

The operations management component 450 examines the plurality of count update vectors to determine if a counter update indication is included in the plurality of count update vectors and directs a counting operation execution if there is a counter update indication. The counter update indication denotes the occurrence of a networking event or existence of a networking condition. Count operations component 430 performs operations on the count values including reading a value from the plurality of count values, adding an addend to the count value and writing a result to the means for storing a plurality of count values. The count update vectors include vectors from media access controllers.

Thus, the present invention is an efficient and convenient system and method for tracking item counts. It provides flexible counting functionality while minimizing consumption of resources. Duplication of arithmetic and decoding logic gates is not required for each item counted. It also reduces the amount of chip space required for storage of the count values by utilizing dense memory components instead of relatively large registers duplicated in counters dedicated to counting a single item.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application with the intent of enabling others skilled in the art to utilize the invention and different embodiments, with various modifications as are suited to the particular use contemplated. It is intended that the scope of the invention be defined by the claims appended hereto and their equivalents.

What is claimed is:

1. A counter system comprising:
   a memory for storing a plurality of counts from different components;
   an adder for adding addends to said plurality of counts, said adder coupled to said memory; and
   a count engine for controlling said adding, wherein said count engine decodes incoming vectors and directs a manipulation of said plurality of counts in accordance with count manipulation indications included in said incoming vectors, said count engine coupled to said memory.

2. A counter system of claim 1 wherein said count engine includes a counter control state machine that directs pipelined count manipulation operations.

3. A counter system of claim 1 wherein said count engine directs selection of addend values provided to said adder for addition to said plurality of count values.

4. A counter system of claim 3 wherein a result of said addition is stored in said memory.

5. A counter system of claim 1 wherein said count engine directs incrementing of said plurality of counts stored in said memory.

6. A counter system of claim 1 further comprising a vector selector for selecting incoming vectors.

7. A counter system of claim 6 wherein said incoming vectors include statistical information.

8. A counter system of claim 6 wherein said vector selector further comprises an input buffer for storing incoming information.

9. A counter system of claim 6 wherein said vector selector further comprises an arbiter for polling incoming vectors.

10. A counter system of claim 1 further comprising a memory input selector for selecting whether an output of said adder or a master data input signal is input to said memory.

11. A counter system of claim 1 further comprising a master control output interface for storing master control output information.

12. A counting method comprising:

receiving information associated with a plurality of count items from multiple elements;

analyzing said information;

storing a plurality of count values in a memory; and executing a count manipulation process on said plurality of count values, including retrieving one of said plurality of count values at a time from said memory location, performing a summing action on one of said plurality of count values retrieved from said memory to produce a result corresponding to said information; and storing the result of said summing action to said memory location.

13. A counting method of claim 12 wherein said count manipulation process comprises adding addends to said plurality of count values.

14. A counting method of claim 12 further comprising determining whether a condition associated with said counting action exists.

15. A counting method of claim 12 wherein said count item information includes statistical information related to operations of a system.

16. A counting method of claim 12 wherein said information includes statistical information related to operations of a network.

17. A counting method of claim 12 wherein said summing action includes incrementing said value.

18. A counting method of claim 12 wherein said summing action includes adding a master control input to said value.

19. A counting method of claim 12 further comprising selecting said information for analysis.

20. A counting system comprising:

a means for gathering a plurality of count update vectors from a variety of devices;

a means for storing a plurality of count values associated with said count update vectors;

a means for performing counting operations on said count values; and a means for managing said counting operations, wherein said means for managing said counting operations examines said plurality of count update vectors to determine if a counter update condition indication is included in said plurality of count update vectors and directs a counting operation execution if a counter update condition indication is included in said plurality of count update vectors.

21. A counting system of claim 20 further comprising a means for polling said plurality of count update vectors.

22. A counting system of claim 21 wherein said means for polling said plurality of count update vectors picks each one of said plurality of count update vectors for decoding one at a time in an arbitration scheme.

23. A counting system of claim 20 wherein said variety of devices include media access controllers.

24. A counting system of claim 20 wherein said counting operations include adding addends to said plurality of count values.

25. A counting system of claim 20 wherein said counter update condition indication indicates the occurrence of a networking event or existence of a networking condition.

26. A counting system of claim 20 wherein said means for performing counting operations on said count values reads a count value from said plurality of count values, adds an addend to said count value and writes a result to said means for storing a plurality of count values.

* * * * *